(12) United States Patent
Kim et al.

(10) Patent No.: US 8,901,586 B2
(45) Date of Patent: Dec. 2, 2014

(54) LIGHT EMITTING DEVICE AND METHOD OF MANUFACTURING THE SAME

(75) Inventors: Hak Hwan Kim, Gyunggi-do (KR); Ho Sun Paek, Gyunggi-do (KR); Hyung Kun Kim, Gyunggi-do (KR); Sung Kyong Oh, Gyunggi-do (KR); Jong In Yang, Gyunggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 317 days.

(21) Appl. No.: 13/181,007

(22) Filed: Jul. 12, 2011

(65) Prior Publication Data

US 2012/0007120 A1 Jan. 12, 2012

(30) Foreign Application Priority Data

Jul. 12, 2010 (KR) .................. 10-2010-0066927
Jul. 12, 2010 (KR) .................. 10-2010-0066928

(51) Int. Cl.
*H01L 33/00* (2010.01)
*H01L 33/38* (2010.01)

(52) U.S. Cl.
CPC ........... *H01L 33/385* (2013.01); *H01L 33/0095* (2013.01); *H01L 33/382* (2013.01)
USPC .......... 257/98; 257/81; 257/91; 257/E33.057; 257/E33.066; 257/E33.068; 438/27; 438/31

(58) Field of Classification Search
USPC ................ 257/81, 91, 98, E33.057, E33.066, 257/E33.068; 438/27, 31
See application file for complete search history.

(56) References Cited

U.S. PATENT DOCUMENTS

| | | | |
|---|---|---|---|
| 8,198,107 B2 * | 6/2012 | Wu et al. ................ | 438/26 |
| 2007/0181895 A1 * | 8/2007 | Nagai ................. | 257/98 |
| 2007/0272939 A1 * | 11/2007 | Peng ................... | 257/99 |
| 2008/0029780 A1 * | 2/2008 | Ohtsuka et al. ......... | 257/99 |
| 2008/0142817 A1 * | 6/2008 | Ibbetson et al. ........ | 257/88 |
| 2008/0169480 A1 * | 7/2008 | Weng et al. ........... | 257/98 |
| 2009/0173963 A1 * | 7/2009 | Hsu et al. ............. | 257/99 |
| 2009/0262516 A1 * | 10/2009 | Li ................... | 362/84 |
| 2010/0096652 A1 * | 4/2010 | Choi et al. ........... | 257/98 |
| 2010/0171135 A1 * | 7/2010 | Engl et al. ........... | 257/98 |
| 2010/0276706 A1 * | 11/2010 | Herrmann ............. | 257/89 |
| 2012/0007101 A1 * | 1/2012 | Yang et al. ........... | 257/76 |

FOREIGN PATENT DOCUMENTS

KR 10-2007-0079956 A 8/2007

* cited by examiner

*Primary Examiner* — Su Kim
(74) *Attorney, Agent, or Firm* — McDermott Will & Emery LLP

(57) ABSTRACT

Disclosed are a light emitting device and a method of manufacturing the same. The light emitting device includes a substrate; a light emitting structure disposed on the substrate and having a stack structure in which a first conductivity type semiconductor layer, an active layer and a second conductivity type semiconductor layer are stacked; a lens disposed on the light emitting structure; and a first terminal portion and a second terminal portion electrically connected to the first conductivity type semiconductor layer and the second conductivity type semiconductor layer, respectively. At least one of the first and second terminal portions extends from a top surface of the light emitting structure along respective side surfaces of the light emitting structure and the substrate.

15 Claims, 6 Drawing Sheets

LIGHT EMITTING DEVICE AND METHOD OF MANUFACTURING THE SAME

CROSS-REFERENCE TO RELATED APPLICATIONS

This application claims the priority of Korean Patent Application Nos. 10-2010-0066927 filed on Jul. 12, 2010 and 10-2010-0066928 filed on Jul. 12, 2010, in the Korean Intellectual Property Office, the disclosures of which are incorporated herein by reference.

BACKGROUND OF THE INVENTION

1. Field of the Invention

The present invention relates to a light emitting device and a method of manufacturing the same.

2. Description of the Related Art

A light emitting diode (LED) is a semiconductor device that can emit light of various colors due to electron-hole recombination occurring at a p-n junction between p-type and n-type semiconductors when a current is supplied thereto. Such an LED is advantageous over a filament-based light emitting device in that it has a long lifespan, low power usage, superior initial-operation characteristics, and high vibration resistance. These factors have continually boosted the demand for LEDs. Notably of late, a great deal of attention has been drawn to group III nitride semiconductors that can emit light in a blue/short wavelength region.

In order to manufacture LEDs, a wafer is processed and subsequently diced into individual chip units. Thereafter, the individual chip units are provided with phosphorus layers, lenses or the like and then subjected to a packaging process. However, the packaging process, performed upon each of the chips, complicates the manufacturing process, increases costs, and interferes with reducing the size of a final package structure. Therefore, there is a demand in this technical field for an appropriate wafer-level packaging technique to simplify the process and achieve a reduction in the size of a device.

SUMMARY OF THE INVENTION

An aspect of the present invention provides a light emitting device capable of achieving a reduction in size and ensuring improved light extraction efficiency by using a chip-sized lens.

An aspect of the present invention also provides a method of manufacturing a light emitting device, capable of simplifying manufacturing processes and reducing manufacturing costs in manufacturing the aforementioned light emitting device.

According to an aspect of the present invention, there is provided a light emitting device including: a substrate; a light emitting structure disposed on the substrate and having a stack structure in which a first conductivity type semiconductor layer, an active layer and a second conductivity type semiconductor layer are stacked; a lens disposed on the light emitting structure; and a first terminal portion and a second terminal portion electrically connected to the first conductivity type semiconductor layer and the second conductivity type semiconductor layer, respectively, wherein at least one of the first and second terminal portions extends from a top surface of the light emitting structure along respective side surfaces of the light emitting structure and the substrate.

The substrate may be an electrically conductive substrate.

The first terminal portion may be disposed on a bottom surface of the substrate, and the second terminal portion may extend from the top surface of the light emitting structure along the respective side surfaces of the light emitting structure and the substrate.

The light emitting device may further include an insulator disposed between the second terminal portion and each of the respective side surfaces of the light emitting structure and the substrate.

The lens may not cover side surfaces of the light emitting structure.

The light emitting device may further include a transparent polymer layer disposed between the lens and the light emitting structure.

The light emitting device may further include a light conversion layer disposed between the lens and the light emitting structure and converting a wavelength of light emitted from the light emitting structure.

The lens may include a micro-lens array formed on a surface thereof.

The substrate may be an electrically insulating substrate.

The first terminal portion may be disposed on a bottom surface of the substrate and electrically connected to the light emitting structure by a conductive via penetrating the substrate, and the second terminal portion may extend from the top surface of the light emitting structure along the respective side surfaces of the light emitting structure and the substrate.

The first and second terminal portions may each extend from the top surface of the light emitting structure along the respective side surfaces of the light emitting structure and the substrate.

According to another aspect of the present invention, there is provided a method of manufacturing a light emitting device, the method including: forming a light emitting structure by growing a first conductivity type semiconductor layer, an active layer and a second conductivity type semiconductor layer on a growth substrate; attaching a support substrate to the light emitting structure and separating the growth substrate from the light emitting structure; forming at least one through hole in the light emitting structure and the support substrate; and forming a terminal portion occupying at least part of the through hole so as to be connected to a top surface of the light emitting structure.

The method may further include forming a lens on the light emitting structure.

The lens may be formed on individual chip units.

The method may further include dicing the light emitting structure and the support substrate into individual chip units.

At least one of portions cut in the dicing of the light emitting structure and the support substrate may include the terminal portion.

The method may further include forming a transparent polymer layer on the light emitting structure.

The method may further include forming a light conversion layer on the light emitting structure, the light conversion layer converting a wavelength of light emitted from the light emitting structure.

The method may further include forming an insulator on an inner wall of the through hole before the forming of the terminal portion.

According to another aspect of the present invention, there is provided a light emitting device including: a substrate; a light emitting structure disposed on the substrate and having a stack structure in which a first conductivity type semiconductor layer, an active layer and a second conductivity type semiconductor layer are stacked; a lens disposed on the light emitting structure; a first terminal portion electrically connected to the first conductivity type semiconductor layer, penetrating the substrate and exposed to the outside; and a second terminal portion electrically connected to the second conductivity type semiconductor layer, penetrating the substrate and exposed to the outside, wherein the second terminal portion has a conductive via penetrating the first conductivity type semiconductor layer and the active layer and connected to the second conductivity type semiconductor layer.

The light emitting device may further include a bonding layer disposed between the light emitting structure and the substrate.

The bonding layer may have an electrically insulating property. In detail, the bonding layer may be formed of silicon resin or epoxy resin.

The bonding layer may have electrical conductivity. In this case, the light emitting device may further include an insulator disposed between the bonding layer and each of the first and second terminal portions.

The substrate may be an electrically insulating substrate.

The substrate may be formed of a material selected from the group consisting of AlN and un-doped silicon.

The substrate may be an electrically conductive substrate.

The light emitting device may further include an insulator disposed between the substrate and each of the first and second terminal portions.

A part of the first terminal portion penetrating the substrate may be formed of the same material as the substrate and may be integrated with the substrate.

The light emitting device may further include an insulator disposed between the conductive via and each of the first conductivity type semiconductor layer and the active layer.

The lens may be formed so as not to cover side surfaces of the light emitting structure.

The light emitting device may further include a transparent polymer layer disposed between the lens and the light emitting structure.

The light emitting device may further include a light conversion layer disposed between the lens and the light emitting structure and converting a wavelength of light emitted from the light emitting structure.

The lens may include a micro-lens array formed on a surface thereof.

According to another aspect of the present invention, there is provided a method of manufacturing a light emitting device, the method including: forming a light emitting structure by growing a first conductivity type semiconductor layer, an active layer and a second conductivity type semiconductor layer on a growth substrate; attaching a support substrate to the light emitting structure and separating the growth substrate from the light emitting structure; forming a first terminal portion electrically connected to the first conductivity type semiconductor layer, penetrating the substrate and exposed to the outside; forming a recess in the light emitting structure and the support substrate to thereby expose the second conductivity type semiconductor layer; and forming a second terminal portion occupying at least part of the recess so as to be connected to the second conductivity type semiconductor layer.

The method may further include forming a lens on the light emitting structure.

The lens may be formed on individual chip units.

The method may further include dicing the light emitting structure and the support substrate into individual chip units.

The method may further include forming a transparent polymer layer on the light emitting structure.

The method may further include forming a light conversion layer on the light emitting structure and converting a wavelength of light emitted from the light emitting structure.

The method may further include forming an insulator on an inner wall of the recess before the forming of the terminal portion.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
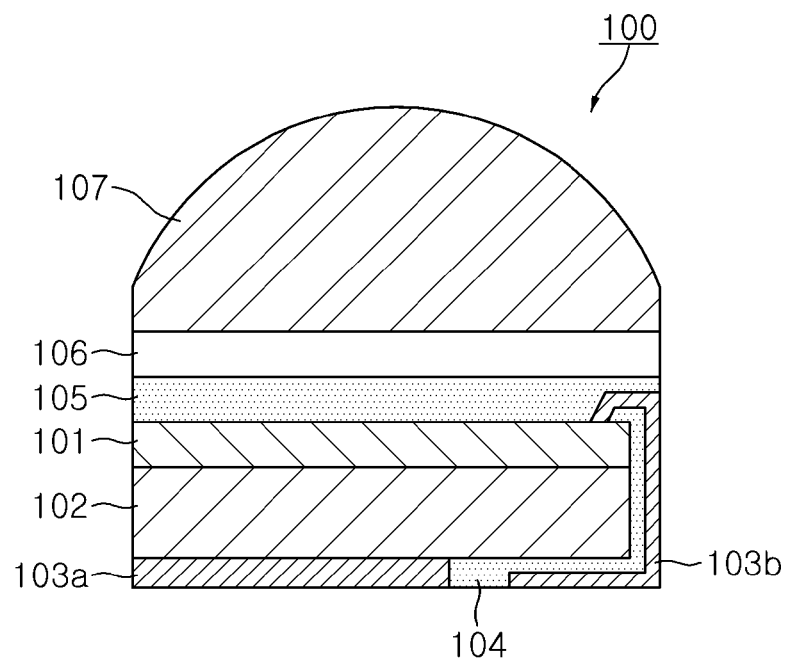
FIG. 1 is a schematic cross-sectional view illustrating a light emitting device according to an embodiment of the present invention.

Embodiments of the present invention will now be described in detail with reference to the accompanying drawings.

The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and sizes of elements may be exaggerated for clarity. Like reference numerals in the drawings denote like elements.

Figure 2:
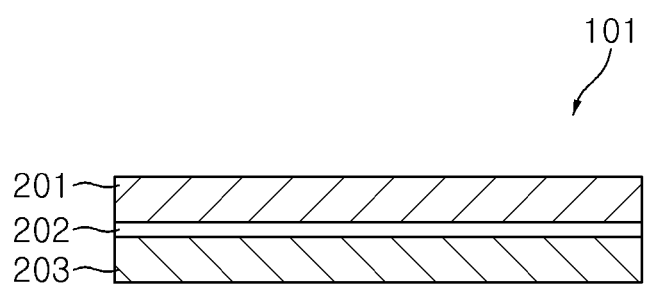
FIG. 2 is a schematic cross-sectional view illustrating a light emitting structure in the light emitting device depicted in FIG. 1.
Figure 3:
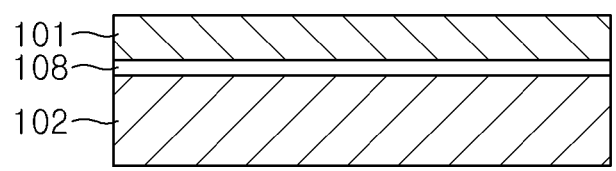
FIG. 3 is an enlarged cross-sectional view illustrating a region between a substrate and the light emitting structure of the light emitting device depicted in FIG. 1.
Figure 4:
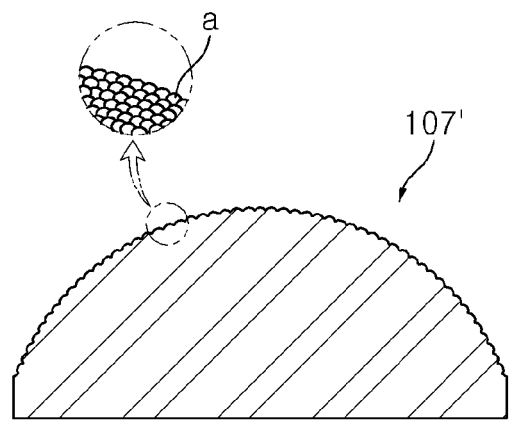
FIG. 4 is an enlarged cross-sectional view illustrating a lens region of the light emitting device depicted in FIG. 1.

FIG. 1 is a schematic cross-sectional view illustrating a light emitting device according to an embodiment of the present invention. FIG. 2 is a schematic cross-sectional view illustrating a light emitting structure in the light emitting device depicted in FIG. 1. FIG. 3 is an enlarged cross-sectional view illustrating a region between a substrate and the light emitting structure of the light emitting device depicted in FIG. 1. FIG. 4 is an enlarged cross-sectional view illustrating a lens region of the light emitting device depicted in FIG. 1.

Referring to FIG. 1, a light emitting device 100, according to this embodiment, includes a substrate 102, a light emitting structure 101 placed on the substrate 102, first and second terminal portions 103a and 103b, a transparent polymer layer 105, a light conversion layer 106 and a lens 107. According to this embodiment, the substrate 102 may utilize an electrically conductive substrate. For example, the substrate 102 may be made of a variety of materials such as Au, Ni, Al, Cu, W, Si, Se, GaAs, GaN, SiC, a mixture thereof or the like. The first terminal portion 103a may be placed on the bottom surface of the substrate 102 and connected to a first conductivity type semiconductor layer 203 of the light emitting structure 101.

Furthermore, the second terminal portion 103b extends along the respective side surfaces of the light emitting structure 101 and the substrate 102 from the top surface of the light emitting structure 101. Thus, the second terminal portion 103b may be connected to a second conductivity type semiconductor layer 201 of the light emitting structure 101. In this case, an insulator 104 may be placed between the second terminal portion 103b and each of the respective side surfaces of the light emitting structure 101 and the substrate 102. The insulator 104 may utilize a silicon oxide, a silicon nitride or the like. Furthermore, the second terminal portion 103b may be bent and extend along the bottom surface of the substrate 102. Since the first and second terminal portions 103a and 103b are placed at the lower portion of the light emitting device 100, the light emitting device 100 can be easily mounted on a printed circuit board (PCB) or the like by using a surface mounting technique (SMT). The first and second terminal portions 103a and 103b may be formed by using a metal having high electrical conductivity.

As shown in FIG. 2, the light emitting structure 100 has a stack structure including the first and second conductivity type semiconductor layers 203 and 201 and an active layer 202 placed therebetween. According to this embodiment, the first and second conductivity type semiconductor layers 203 and 201 may be p-type and n-type semiconductor layers, respectively, and may be formed of a nitride semiconductor, for example, $Al_xIn_yGa_{(1-x-y)}N$, wherein $0 \leq x \leq 1$, $0 \leq y \leq 1$ and $0 \leq x+y \leq 1$. However, GaAs-based semiconductors or GaP-based semiconductors, other than the nitride semiconductor, may be utilized for the first and second conductivity type semiconductor layers 203 and 201. The active layer 202 provided between the first and second conductivity type semiconductor layers 203 and 201 emits light having a predetermined level of energy through electron-hole recombination. The active layer 202 may have a multi-quantum well (MQW) structure in which quantum well and quantum barrier layers are alternately stacked. The multi-quantum well structure may employ an InGaN/GaN structure, for example. The first and second conductivity type semiconductor layers 203 and 201 and the active layer 202 may be formed by using a known semiconductor-layer growth technique such as MOCVD, MBE, HVPE or the like.

As shown in FIG. 3, a bonding layer 108 may be placed between the light emitting structure 101 and the substrate 102. The bonding layer 108 may be made of a eutectic metal such as AuSn or a conductive polymer such as conductive epoxy. The bonding layer 108 is not necessarily made of a conductive material, and a non-conductive bonding material may be used. However, in this case, the first terminal portion 103a may be connected to the first conductivity type semiconductor layer 203 through a via structure penetrating the bonding layer 108 (see FIG. 11). However, a reflective metal layer (not shown) may be further provided between the light emitting structure 101 and the substrate 102. The reflective metal layer may serve to reflect light, emitted from the light emitting structure 101, in an upward direction of the light emitting device 100, that is, a direction toward the lens 107 and to form an ohmic-contact with the first conductivity type semiconductor layer 203. In due consideration of such a function, the reflective metal layer may contain Ag, Ni, Al, Rh, Pd, Ir, Ru, Mg, Zn, Pt, Au or the like.

As shown in FIG. 1, the transparent polymer layer 105 is placed on the top surface of the light emitting structure 101. The transparent polymer layer 105 may be formed of a silicon resin, an epoxy resin or the like to thereby provide stable bonding with the light conversion layer 106 placed thereon. Also, the transparent polymer layer 105 may cover the upper portion of the second terminal portion 103b to thereby provide a flat surface before the formation of the light conversion layer 106. However, the transparent polymer layer 105 is not an essential element in the present invention, and the light conversion layer 106 or the lens 107 may be directly formed without the transparent polymer layer 105. Although not shown, the transparent polymer layer 105 may have a reflective wall structure in the edge thereof to thereby adjust the orientation angle of light emitted toward the outside.

The light conversion layer 106 serves to convert a wavelength of light emitted from the light emitting structure 101, and may contain a wavelength conversion material such as phosphors or quantum dots. In this case, the wavelength conversion material may be solely formed as a plate (e.g., a ceramic converting body), or may be provided as a film structure by being distributed in a silicon resin or the like. In this case, if the wavelength conversion material is phosphors and blue light is emitted from the light emitting structure 101, red phosphors may include nitride-based phosphors of $MAlSiNx:Re$ ($1 \leq x \leq 5$), sulfide-based phosphors of MD:Re, and the like. Here, M denotes at least one selected from the group consisting of Ba, Sr, Ca and Mg, D denotes at least one selected from the group consisting of S, Se and Te, and Re denotes at least one selected from the group consisting of Eu, Y, La, Ce, Nd, Pm, Sm, Gd, Tb, Dy, Ho, Er, Tm, Yb, Lu, F, Cl, Br and I. Furthermore, green phosphors may include silicate-based phosphors of $M_2SiO_4:Re$, sulfide-based phosphors of $MA_2D_4:Re$, phosphors of $\beta$-SiAlON:Re, oxide-based phosphors of $MA'_2O_4:Re'$. Here, M denotes at least one selected from the group consisting of Ba, Sr, Ca and Mg, A denotes at least one selected from the group consisting of Ga, Al and In, D denotes at least one selected from the group consisting of S, Se and Te, A' denotes at least one selected from the group consisting of Sc, Y, Gd, La, Lu, Al and In, Re denotes at least one selected from the group consisting of Eu, Y, La, Ce, Nd, Pm, Sm, Gd, Tb, Dy, Ho, Er, Tm, Yb, Lu, F, Cl, Br and I, and Re' may be at least one selected from the group consisting of Ce, Nd, Pm, Sm, Tb, Dy, Ho, Er, Tm, Yb, F, Cl, Br and I.

Furthermore, the quantum dots are nano crystal particles, each consisting of a core and a shell. The core sizes of the quantum dots may range from about 2 nm to 100 nm. By controlling the core sizes, the quantum dots may act as phosphors that emit light of various colors such as blue (B), yellowy (Y), green (G) and red (R). The core-shell structure of each of the quantum dots may be obtained by a hetero-junction between at least two kinds of semiconductors among group II-VI compound semiconductors such as ZnS, ZnSe, ZnTe, CdS, CdSe, CdTe, HgS, HgSe, HgTe, MgTe and the like, group III-V compound semiconductors such as GaN, GaP, GaAs, GaSb, InN, InP, InAs, InSb, AlAs, AlP, AlSb, AlS and the like, or group IV semiconductors such as Ge, Si, Pb and the like. In this case, an organic ligand using a material such as an oleic acid may be provided on the outer surface of the shell of the quantum dot in order to terminate a molecular bond on the outer surface of the shell, suppress agglomeration between the quantum dots, improve the dispersibility thereof within a resin such as a silicon resin or an epoxy resin, or enhance its function as a phosphor.

The lens 107 is placed over the top surface of the light emitting structure 101 to thereby control the orientation angle of light. As will be described below, the lens 107 is not separately provided as a manufactured package but is fabricated at a wafer-level and is then subjected to a dicing process together with the light emitting structure 101 and the substrate 102. In this case, as shown in FIG. 1, the lens 107 placed over the top surface of the light emitting structure 10 does not cover the side surfaces of the light emitting structure 101. This contributes to reducing the size of the light emitting device 100 and allows more chips to be obtained from the same-sized wafer at a manufacturing stage. Alternatively, as shown in FIG. 4, a lens 107' may include a micro-lens array a on the surface thereof. The micro-lens array a, formed on the surface of the lens 107', may contribute to further enhancing light extraction efficiency.

Hereinafter, one example of the process of manufacturing a light emitting device having the above-described structure will be described. FIGS. 5 through 10 are schematic cross-sectional views illustrating a method of manufacturing a light emitting device according to an embodiment of the present invention.

Figure 5:
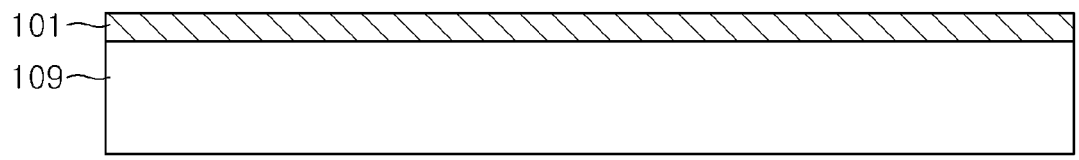
FIGS. 5 through 10 are schematic cross-sectional views illustrating a method of manufacturing a light emitting device according to an embodiment of the present invention.

First, as shown in FIG. 5, the light emitting structure 101 is formed on a growth substrate 109. The growth substrate 109 is used as a base substrate for growing semiconductor single crystals, for example, a sapphire substrate. Sapphire is a crystal having Hexa-Rhombo R3C symmetry and has a lattice constant of 13.001☐ along a C-axis and a lattice constant of 4.758☐ along an A-axis. Orientation planes of the sapphire include a C (0001) plane, an A (1120) plane, an R (1102) plane, and the like. Particularly, the C plane is mainly used as a substrate for nitride growth because it relatively facilitates the growth of a nitride film and is stable at a high temperature. Of course, as for the growth substrate 109, a substrate formed of SiC, GaN, ZnO, $MgAl_2O_4$, MgO, $LiAlO_2$ or $LiGaO_2$ may be used.

As shown in FIG. 2, the light emitting structure 101 includes the first and second conductivity type semiconductor layers 203 and 201 and the active layer 202, and the first conductivity type semiconductor layer 203 is disposed adjacent to the substrate 102. Therefore, the second conductivity type semiconductor layer 201 is grown first on the growth substrate 109. In this case, the first and second conductivity type semiconductor layers 203 and 201 and the active layer 202 may be grown by using a process such as MOCVD, MBE, HVPE or the like.

Figure 6:
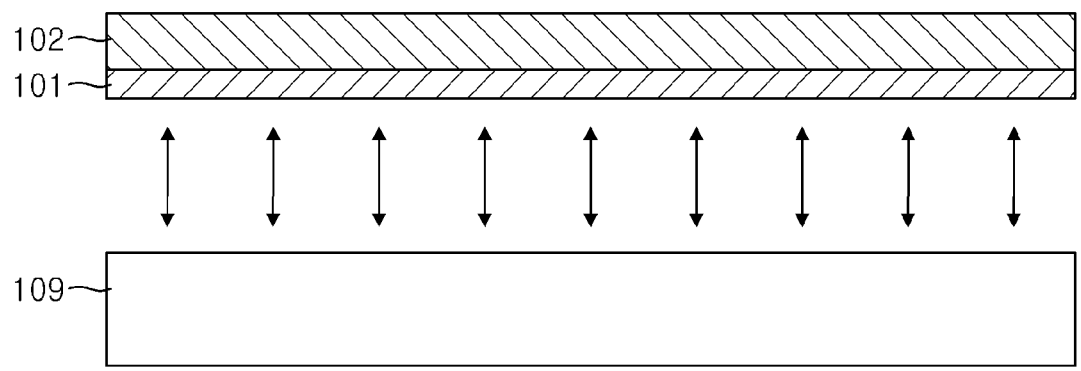

As shown in FIG. 6, the substrate 102 is attached to the light emitting structure 101 as a support. Thereafter, the growth substrate 109 is separated from the light emitting structure 101. The substrate 102 serves as a support that supports the light emitting structure 101 when a process such as a laser lift-off process is carried out in order to remove the growth substrate 102. The substrate 102, when formed of a conductive material, may serve to transfer an electrical signal to the light emitting structure 101. In this case, the substrate 102 may be formed by a method such as plating or bonding. However, as will be described below, the substrate 102 is not necessarily formed of a conductive material, and may be formed of a non-conductive material, such as alumina, AlN, un-doped silicon or the like. The separation of the growth substrate 109 may be performed by a laser lift-off process of emitting laser beams to a region between the growth substrate 109 and the light emitting structure 101. However, the present invention is not limited thereto. For example, a chemical lift-off process or the like may be used for the separation of the growth substrate 109.

Figure 7:
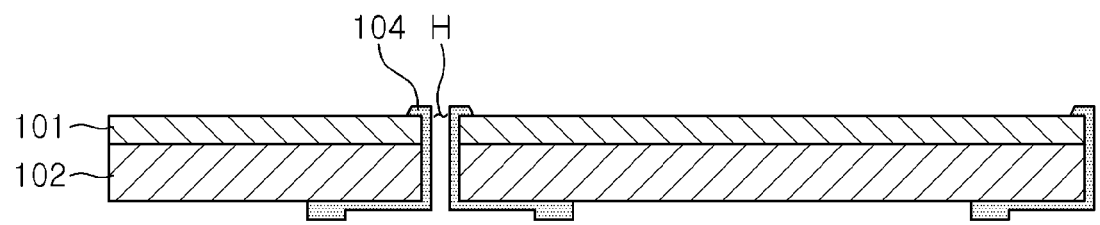

Thereafter, as shown in FIG. 7, a through hole H is formed in the light emitting structure 101 and the substrate 102. In FIG. 7, a single through hole H is illustrated as an example. However, two or more through holes H may be formed according to the number of devices to be manufactured. In this embodiment, the through hole H is formed after the light emitting structure 101 and the substrate 102 are bonded together. However, the light emitting structure 101 and the substrate 102 may be bonded after through holes H are individually formed therein. Thereafter, the insulator 104 is formed on the inner wall of the through hole H by using a process such as deposition. As described above, the insulator 104 serves to prevent the terminal portion from directly contacting the light emitting structure 101 and the substrate 102 having electrical conductivity. In this case, the insulator 104 may extend appropriately to a portion other than the inner wall of the through hole H, depending on the formation of the second terminal portion 103b. For example, as shown in FIG. 7, the insulator 104 may be formed along the bottom surface of the substrate 102.

Figure 8:
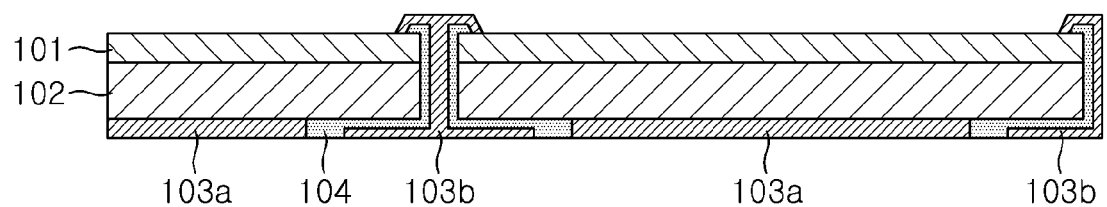

Thereafter, as shown in FIG. 8, the first and second terminal portions 103a and 103b are formed. At this time, a known method such as deposition or plating may be appropriately used. According to this embodiment, the first terminal portion 103a is formed on the bottom surface of the substrate 102 and connected to the light emitting structure 101, and the second terminal portion 103b extends from the top surface of the light emitting structure 101, fills the through hole H and covers a portion of the bottom surface of the substrate 102.

Figure 9:
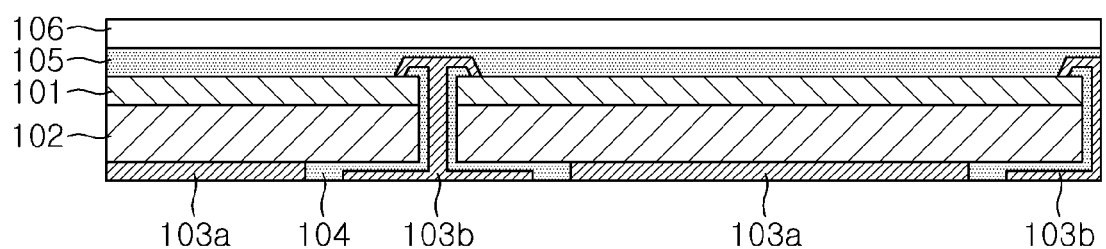
Figure 10:
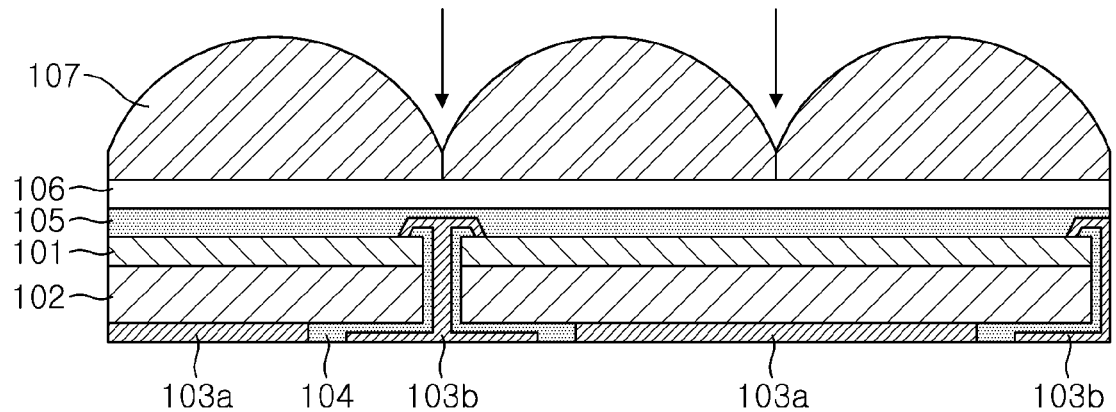

Subsequently, as shown in FIG. 9, the transparent polymer layer 105 and the light conversion layer 106 are formed on the light emitting structure 101, and the lens 107 is then formed thereon as shown in FIG. 10. Here, the lens 107 is provided in the form of a wafer level lens having a structure in which a plurality of lenses are integrated, rather than being separated into individual chip units in advance. This wafer level lens may be separately produced and then attached over the light emitting structure. Alternatively, the wafer level lens may be molded into individual lenses after being attached thereto. Thereafter, the resultant structure including the attached lens 107 is cut into individual light emitting devices in a direction of arrows as indicated in FIG. 10. In such a manner, in the embodiment illustrated in FIG. 10, three light emitting devices can be obtained.

Figure 11:
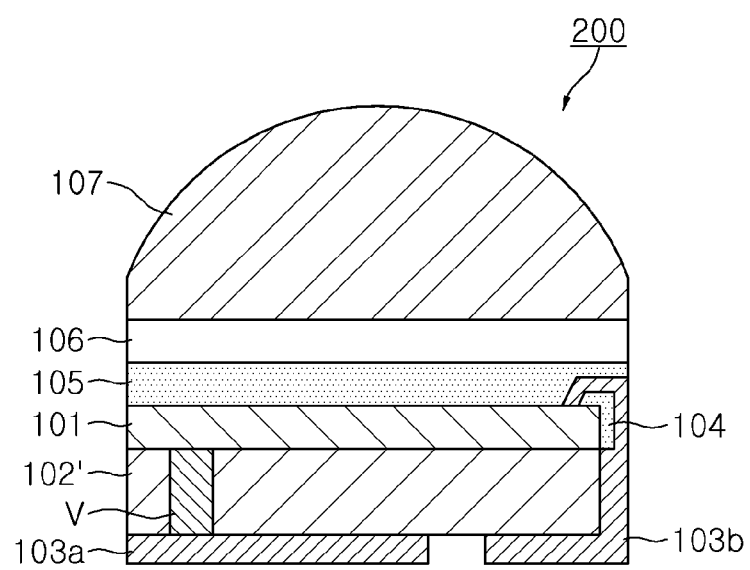
FIG. 11 is a schematic cross-sectional view illustrating an alternative to the light emitting device of the embodiment depicted in FIG. 1.

FIG. 11 is a schematic cross-sectional view illustrating an alternative to the light emitting device of the embodiment depicted in FIG. 1. According to this embodiment, a light emitting device 200 employs an electrically insulating substrate 102' unlike the previous embodiment. For example, the electrically insulating substrate 102' may be formed of, for example, alumina, AlN, un-doped silicon or the like. Due to the use of the electrically insulating substrate 102', the first terminal portion 103a may be connected to the light emitting structure 101 through a conductive via V, and the insulator 104 may not be placed between the substrate 102' and the second terminal portion 103b.

While the previous embodiment is associated with a structure in which an external electrical signal is supplied through the top and bottom surfaces of the light emitting structure 101, a pair of electrodes of the light emitting structure 101 may be arranged to face in the same direction. In detail, if the pair of electrodes are arranged toward the lens 107, the first terminal portion 103a may have the same structure as the second terminal portion 103b, that is, a structure which extends from the top surface of the light emitting structure 101 toward the side surfaces of the light emitting structure 101 and the substrate 102 (or 102'). Furthermore, if the pair of electrodes are arranged toward the substrate 102 (or 102'), that is, if they are provided in a flip-chip structure, the first and second terminal portions 103a and 103b may be electrically connected to the light emitting structure 101 through a conductive via V penetrating the substrate 102 (or 102').

Figure 12:
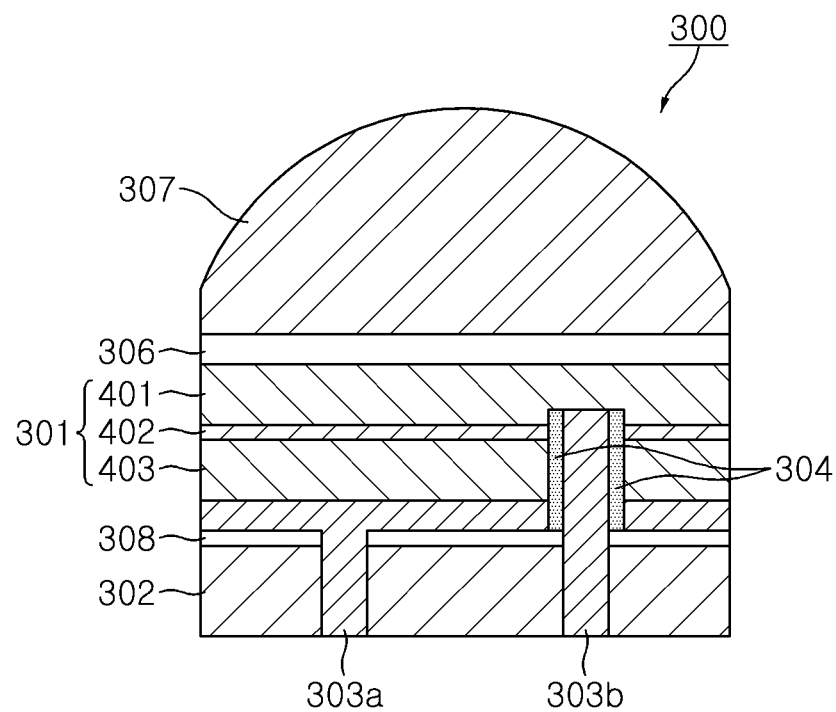
FIG. 12 is a schematic cross-sectional view illustrating a light emitting device according to another embodiment of the present invention.

FIG. 12 is a schematic cross-sectional view illustrating a light emitting device according to another embodiment of the present invention. Referring to FIG. 12, a light emitting device 300, according to this embodiment of the present invention, includes a substrate 302, a light emitting structure 301 disposed over the substrate 302, first and second terminal portions 303a and 303b, a light conversion layer 306, and a lens 307. Although not shown in FIG. 12, a transparent polymer layer may be disposed between the light emitting structure 301 and the light conversion layer 306. As for the difference of this embodiment to the previous embodiment, the substrate 302 employs an electrically insulating substrate, and the first terminal portion 303a, while having a bottom surface exposed to the outside, may be connected to a first conductivity type semiconductor layer 403 through a conductive via penetrating the substrate 302. In this case, apart of the first terminal portion 303a positioned between the first conductivity type semiconductor layer 403 and the substrate 302 may be provided as a reflective metal layer forming an ohmic-contact with the first conductivity type semiconductor layer 403 and having a light reflection function.

Like the first terminal portion 303a, the second terminal portion 303b includes a conductive via penetrating the substrate 302 and has a bottom surface exposed to the outside. Furthermore, the second terminal portion 303b may be provided with a conductive via penetrating the first conductivity type semiconductor layer 403 and an active layer 402 and connected to the second conductivity type semiconductor layer 401. An insulator 304 is placed between the conductive via, connected to the second conductivity type semiconductor layer 401, and each of the active layer 402 and the first conductivity type semiconductor layer 403, thereby preventing the occurrence of a short-circuit. Due to the second terminal portion 303b having the aforementioned structure, a part that may cause interference with the passage of light does not exist on the top surface of the light emitting structure 301, thereby enhancing light extraction efficiency. Also, since a contact area is positioned inside the second conductivity type semiconductor layer 401, it may be favorable to current distribution. To be even more favorable for current distribution, the second terminal portion 303b may be provided with two or more conductive vias contacting the second conductivity type semiconductor layer 401. In the embodiment shown in FIG. 12, the conductive vias are illustrated as being integrated, that is, the conductive via in the substrate 302 and the conductive via in the light emitting structure 301 are illustrated as forming a single conductive via. However, the present invention is not limited thereto, and the two conductive vias may be spatially separated, provided that they are electrically connected with each other.

A bonding layer 308 may be disposed between the light emitting structure 301 and the substrate 302 or between the reflective metal layer of the first terminal portion 303a and the substrate 302 as in this embodiment. The bonding layer 308 may be formed of an electrically insulating material. As the electrically insulating material for the bonding layer 308, silicon resin, epoxy resin or the like may be used. This may contribute to achieving lower processing costs than a case in which a conductive bonding material such as AuSn is used.

Figure 13:
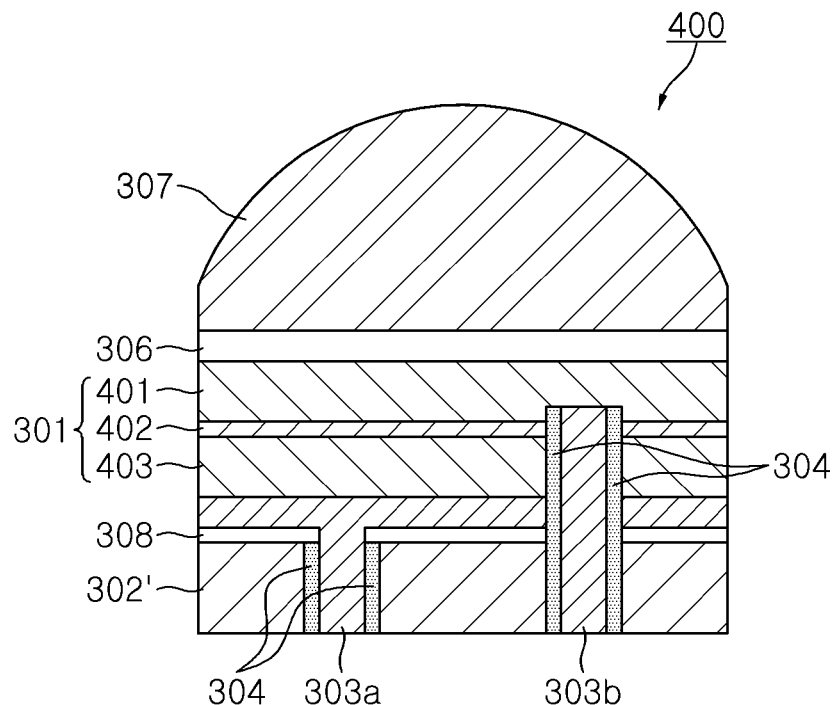
FIGS. 13 through 15 are schematic cross-sectional views illustrating alternatives to the light emitting device of the embodiment depicted in FIG. 12.
Figure 14:
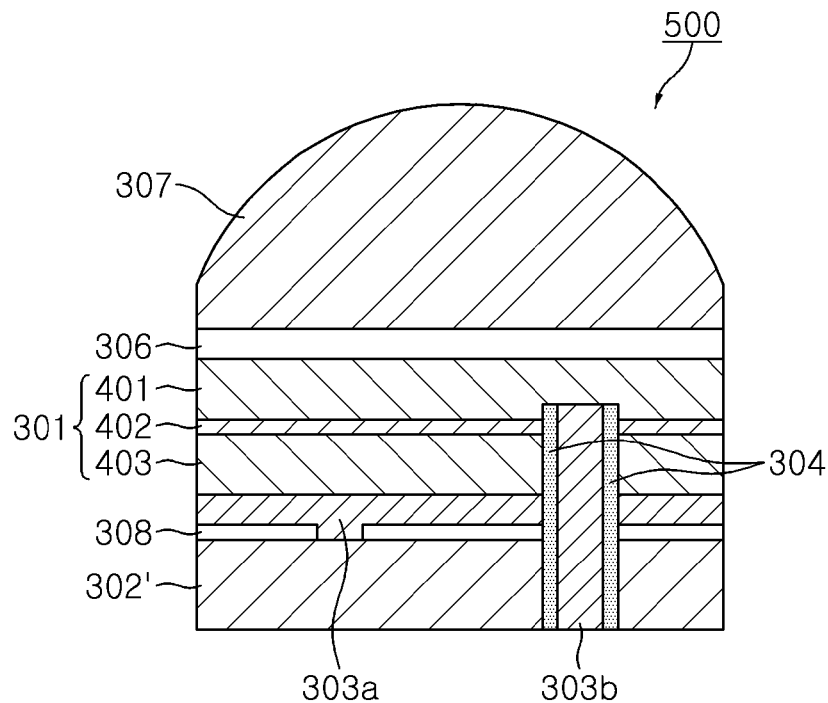
Figure 15:
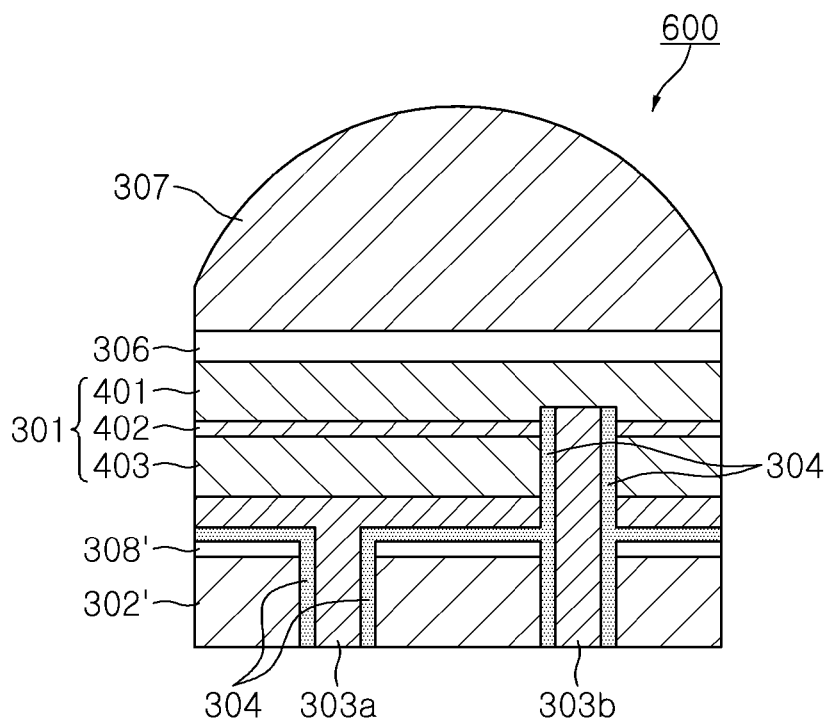

FIGS. 13 through 15 are schematic cross-sectional views illustrating alternatives to the light emitting device of the embodiment depicted in FIG. 12. According to the alternative embodiment shown in FIG. 13, unlike the embodiment depicted in FIG. 12, an electrically conductive substrate 302' is used, which is made of a variety of materials such as Au, Ni, Al, Cu, W, Si, Se, GaAs, GaN, SiC, a mixture thereof or the like. Accordingly, the insulator 304 is further provided between the substrate 302' and each of the first and second terminal portions 303a and 303b.

According to the alternative embodiment shown in FIG. 14, a light emitting device 500 employs the electrically conductive substrate 302' and has the first terminal portion 303a which is not directly exposed to the outside. The first terminal portion 303a is connected to the first conductivity type semiconductor layer 403 and also connected to the substrate 302' by penetrating the bonding layer 308 having an electrically insulating property. In this case, the substrate 302' may be considered to act as a terminal portion even if the first terminal portion 303a is not directly exposed to the outside.

According to the alternative embodiment shown in FIG. 15, a light emitting device 600 employs a bonding layer 308' having electrical conductivity, unlike the previous embodiment in which the electrically insulating bonding layer 308 is used. As the electrically conductive bonding layer 308', a eutectic metal layer, such as AuSn, or a conductive epoxy may be used. Due to the bonding layer 308' having electrical conductivity, the insulator 304 extends between the bonding layer 308' and each of the first and second terminal portions 303a and 303b.

As described above, the light emitting device proposed by the present invention employs both an electrically insulating material and an electrically conductive material for a substrate and a bonding layer. Therefore, internal electrical connections and insulating structures may be varied in various manners.

Meanwhile, the light emitting devices according to the embodiments shown in FIGS. 12 through 15 can be fabricated by appropriately modifying the manufacturing method described above with reference to FIGS. 5 through 10. As for modifications made in the process, a recess that does not penetrate the light emitting structure 301 is formed instead of the through hole to thereby form a conductive via connected to the second conductivity type semiconductor layer 401. As for another modification, according to the embodiments shown in FIGS. 12 through 15, the conductive vias of the first and second terminal portions 303a and 303b are not provided as a portion to be diced, while the second terminal portion 103b according to the embodiments depicted in FIGS. 5 through 10 is formed along the side surfaces of the light emitting structure 101 and the substrate 102 and thus is provided as a portion to be diced.

As set forth above, according to embodiments of the invention, a light emitting device can achieve a reduction in size and ensure enhanced light extraction efficiency by using a chip-sized lens. Furthermore, a process of manufacturing such a light emitting device can be simplified, and manufacturing costs can be reduced.

While the present invention has been shown and described in connection with the embodiments, it will be apparent to those skilled in the art that modifications and variations can be made without departing from the spirit and scope of the invention as defined by the appended claims.

What is claimed is:
1. A light emitting device, comprising:
   a substrate;
   a light emitting structure disposed on the substrate, the light emitting structure having a stack structure in which a first conductivity type semiconductor layer, an active layer and a second conductivity type semiconductor layer are stacked;

a first terminal portion electrically connected to the first conductivity type semiconductor layer, penetrating the substrate and exposed to the outside;

a second terminal portion electrically connected to the second conductivity type semiconductor layer, penetrating the substrate and exposed to the outside; and a lens disposed on the light emitting structure, wherein:

the lens is formed so as not to cover side surfaces of the light emitting structure, and the second terminal portion has a conductive via penetrating the first terminal portion, the first conductivity type semiconductor layer and the active layer and is connected to the second conductivity type semiconductor layer.

2. The light emitting device of claim 1, further comprising a bonding layer disposed between the light emitting structure and the substrate.

3. The light emitting device of claim 2, wherein the bonding layer has an electrically insulating property.

4. The light emitting device of claim 3, wherein the bonding layer is formed of silicon resin or epoxy resin.

5. The light emitting device of claim 2, wherein the bonding layer has electrical conductivity.

6. The light emitting device of claim 5, further comprising an insulator disposed between the bonding layer and each of the first and second terminal portions.

7. The light emitting device of claim 1, wherein the substrate is an electrically insulating substrate.

8. The light emitting device of claim 7, wherein the substrate is formed of a material selected from the group consisting of AlN and un-doped silicon.

9. The light emitting device of claim 1, wherein the substrate is an electrically conductive substrate.

10. The light emitting device of claim 9, further comprising an insulator disposed between the substrate and each of the first and second terminal portions.

11. A light emitting device, comprising:

a substrate;

a light emitting structure disposed on the substrate, the light emitting structure having a stack structure in which a first conductivity type semiconductor layer an active layer and a second conductivity type semiconductor layer are stacked;

a first terminal portion electrically connected to the first conductivity type semiconductor layer, penetrating the substrate and exposed to the outside; and a second terminal portion electrically connected to the second conductivity type semiconductor layer, penetrating the substrate and exposed to the outside, wherein:

the second terminal portion has a conductive via penetrating the first terminal portion the first conductivity type semiconductor layer and the active layer and is connected to the second conductivity type semiconductor layer, the substrate is an electrically conductive substrate, and a part of the first terminal portion penetrating the substrate is formed of the same material as the substrate and is integrated with the substrate.

12. The light emitting device of claim 1, further comprising an insulator disposed between the conductive via and each of the first conductivity type semiconductor layer and the active layer.

13. The light emitting device of claim 1, further comprising a transparent polymer layer disposed between the lens and the light emitting structure.

14. The light emitting device of claim 1, further comprising a light conversion layer disposed between the lens and the light emitting structure and converting a wavelength of light emitted from the light emitting structure.

15. The light emitting device of claim 1, wherein the lens includes a micro-lens array formed on a surface thereof.

* * * * *